United States Patent [19]

Bonanomi

[11] 4,307,336

[45] Dec. 22, 1981

[54] PROCESS AND SYSTEM FOR THE DETERMINATION OF A LONGITUDINAL EQUIVALENT REACTANCE IN AN ELECTRIC POWER SUPPLY LINE

[75] Inventor: Peter Bonanomi, Zurich, Switzerland

[73] Assignee: BBC Brown, Boveri & Company, Ltd., Baden, Switzerland

[21] Appl. No.: 131,662

[22] Filed: Mar. 19, 1980

[30] Foreign Application Priority Data

Mar. 23, 1979 [CH] Switzerland ............... 2735/79

[51] Int. Cl.³ .................................... G01R 27/00
[52] U.S. Cl. ............................................ 324/57 R
[58] Field of Search ................. 324/57 R, 141, 83 R

[56] References Cited

U.S. PATENT DOCUMENTS

| | | | |
|---|---|---|---|
| 2,592,750 | 4/1952 | Selove | 324/57 R |
| 2,593,175 | 4/1952 | Packard et al. | 324/57 R |
| 2,595,297 | 5/1952 | Relis | 324/57 R |
| 3,445,763 | 5/1969 | Harris, Jr. | 324/57 R |
| 3,818,332 | 6/1974 | Schlosser | 324/57 R |

Primary Examiner—Stanley T. Krawczewicz
Attorney, Agent, or Firm—Oblon, Fisher, Spivak, McClelland & Maier

[57] ABSTRACT

A process and system for the purpose of running and controlling electrical high-voltage power lines, particularly of the pertinent generators, wherein a line identification is required with the determination of the longitudinal equivalent reactance of each line section coupled with a measuring point or with a generator connected there, the generator being represented by this longitudinal reactance between the measuring point and a point on the line with amplitude and phase-rigid line voltage. The reactance is determined continuously from the local measured dimensions (P, Q, $V_1$) by using a majority of predetermined values ($X_{e1}$-$X_{e3}$) of the searched for reactance through similarity comparison of the time developents of phase angle differences ($d_1$ to $d_3$) formed by the predetermined values ($X_{e1}$-$X_{e3}$) and the local phase angle ($d_m$).

9 Claims, 4 Drawing Figures

PROCESS AND SYSTEM FOR THE DETERMINATION OF A LONGITUDINAL EQUIVALENT REACTANCE IN AN ELECTRIC POWER SUPPLY LINE

BACKGROUND OF THE INVENTION

1. Field of the Invention

This invention refers to a process for the determination of a longitudinal equivalent reactance in an electric power supply line with reference to a measuring point, particularly at the connecting point of a generator in a supply line. The invention further refers to a system for the determination of the phase angle of a system voltage at a measuring point as it can especially be used for the implementation of the above-mentioned process.

2. Description of the Prior Art

For the running and controlling of electric high-efficiency power lines, and particularly for the control of generators operating in a power system, certain reactance values of the supply line are required as parameter dimensions or signals. This includes the longitudinal equivalent reactance with reference to a measuring point, i.e. the longitudinal reactance between the system voltage at the measuring point, on the one hand, and a system voltage to be assumed as amplitude and phase-fixed which, therefore, limits the system section coupled with the respective measuring point or with the generator connected here. It is, in this instance, essentially a question of the inner reactance of a substitute source representing the mentioned supply line section with the given, fixed supply line voltage as impressed source voltage. Since it is a question of a longitudinal reactance, the resistances and capacitances can, in general, be neglected vis-a-vis the inductances which justifies the sole treatment of an equivalent reactance.

The value of the longitudinal equivalent reactance of a power line with reference to a measured point can, in principle, be determined from the entire power line configuration by taking into consideration the respective load conditions. However, such a determination is not applicable in practice during operation because the load condition and also the power line configuration are subjected to more or less important, current changes and, for this reason, an extensive measuring and data transmission system would be a prerequisite.

SUMMARY OF THE INVENTION

Accordingly, one object of this invention is to provide a novel process and system for the determination of the longitudinal equivalent reactance with reference to a measuring point by exclusively using measured dimensions available at the measuring point whereby the resources must be kept, in principle, within such a framework that a repeated or current reactance determination is possible for the purposes of the running of the power line and the generator adjustment.

This object is achieved according to the invention by providing a novel process and system wherein the reactance is continuously measured from locally measured parameters of power and voltage (P, Q, V) by using a majority of given values ($X_{e1}$–$X_{e3}$) of the sought after reactance through a similarity comparison of the time developments of phase angle differences ($d_1$–$d_3$) formed between the given reactance values ($X_{e1}$–$X_{e3}$) and the local phase angle difference ($d_m$).

The basic concept of the invention consists of determining the pertinent values of the line voltage phase angle difference on both sides of this reactance for a majority of given values of the searched-for longitudinal equivalent reactance by using measured dimensions, i.e. system voltage, real power and apparent power, exclusively obtained at the measuring point, and of comparing them with a phase angle of the local line voltage determined directly from the mentioned measured dimensions vis-a-vis a local reference. The relatively best agreement between a phase angle difference computed with an equivalent reactance value and the local line voltage phase angle is then used as criterion for the selection of the pertinent, given reactance value as an approximate result. The mentioned phase angle difference on both sides of the longitudinal reactance is actually nothing else but the phase angle of the local line voltage vis-a-vis the fixed equivalent source voltage.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1:
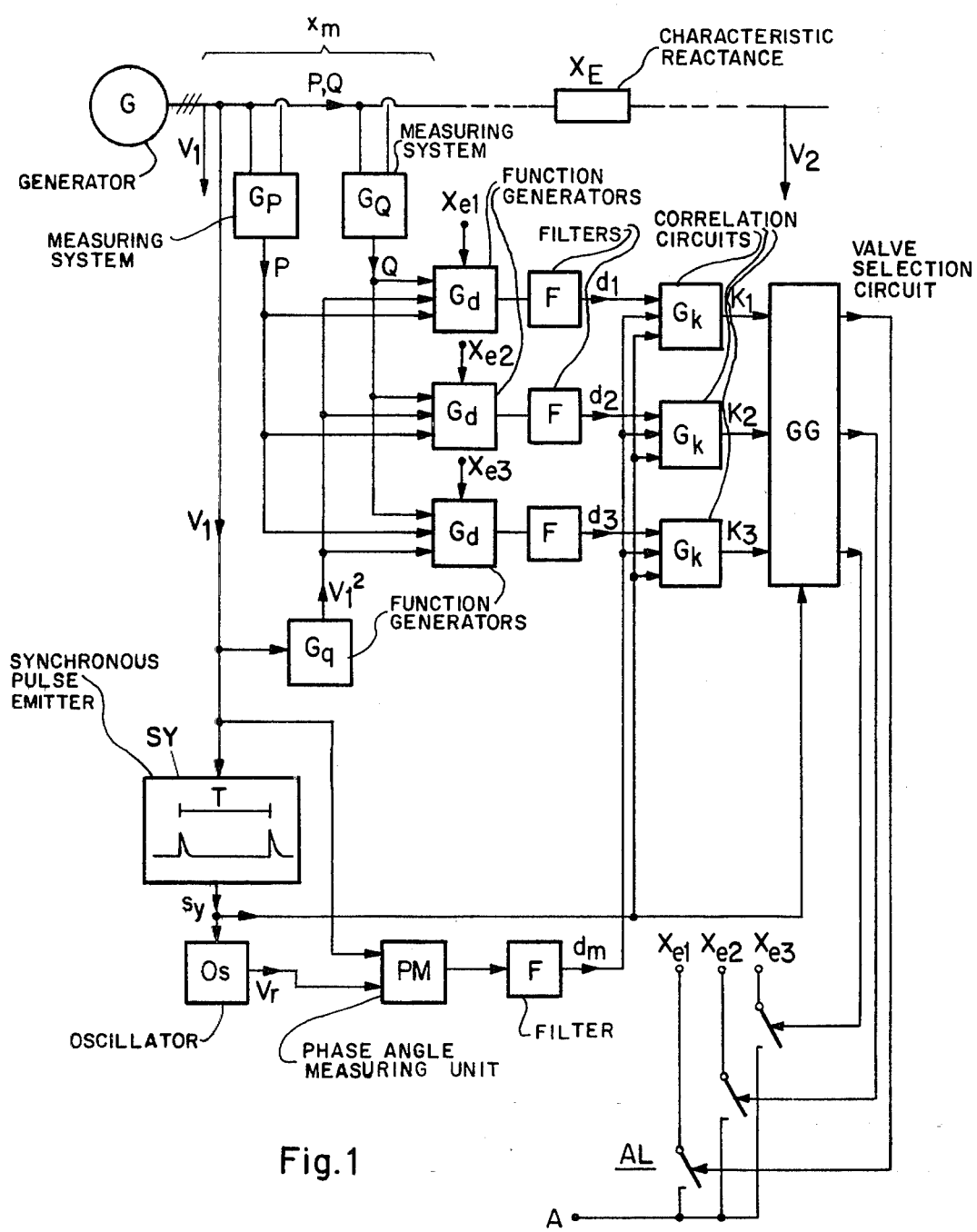
FIG. 1 is a block diagram of a circuit arrangement for the determination of equivalent reactance in accordance with the process according to the invention.

Referring now to the drawings, wherein like reference numerals designate identical or corresponding parts throughout the several views, and more particularly to FIG. 1 thereof, the local line voltage $V_1$ as well as the real power P and the apparent power Q are determined at a measuring point $x_m$, for example, the connecting point of a generator G, in corresponding measuring systems $G_P$ and $G_Q$. The line section coupled with the measuring point or the generator, respectively, is represented in accordance with the aforementioned explanations by an equivalent source with the characteristic reactance $X_E$ and with the fixed source voltage $V_2$. The real power P is taken in or given off by this fixed source.

Corresponding time developments of a line voltage phase angle difference $d_1$ to $d_3$ are then formed from P and Q as well as the square $V_1^2$ of the local line voltage formed in a function generator $G_q$ in a majority of function generators $G_d$, each with a given equivalent reactance value $X_{e1}$ to $X_{e3}$ supplied from outside. These function generators operate in accordance with the actually generally known relations $$d_1 = \arctan\left(\frac{P}{\frac{V_1^2}{X_{e1}} - Q}\right) \quad (1)$$

$$d_2 = \arctan\left(\frac{P}{\frac{V_2^2}{X_{e2}} - Q}\right) \quad (2)$$

$$d_3 = \arctan\left(\frac{P}{\frac{V_3^2}{X_{e3}} - Q}\right) \quad (3)$$

Generally, customary analog or digital circuits can be used, which are commercially available, for the implementation of such a function and they are, therefore, not further explained here.

Furthermore, the local line voltage $V_1$ is supplied to a phase angle measuring unit PM together with an at least approximately fixed reference voltage $V_r$ from a local oscillator OS and thus the local line voltage phase angle $d_m$ is formed in the form of a measured dimension. The signals or measured dimensions $d_1$ to $d_3$ and $d_m$ are led through filters F which suppress components linear in time of the respective signals, i.e. equal and ramp components, which are without interest for the usual dynamic running and controlling and would make the subsequent similarity analysis more difficult. Suitable, actually customary filter circuits with differential and integral components of their transmission function can be used here, in principle.

Subsequently, the course of one phase angle difference $d_1$ to $d_3$ each is subjected to a similarity analysis in relation to the course of the local phase angle $d_m$ in a correlation circuit $G_k$. These are fundamentally customary correlation circuits, for example, integrating cross correlators which supply one correlate $K_1$ to $K_3$ each as a characteristic similarity quantity. In the case of the example, it is assumed that the integration of those correlators and thus the similarity analysis is effected over defined time intervals always corresponding to a certain development section of the supplied signal. For this purpose, a synchronous pulse emitter SY is provided which omits a synchronizing or resetting signal $s_y$ to the correlators. This signal is useful for a periodic synchronization of the oscillator US with the local line voltage to correct possible drift phenomena. Furthermore, this signal effects the output of the correlates $K_1$ to $K_3$ to a limit value selection circuit GG always just before the resetting of the correlator integrators. In the case of a simple cross correlation whereby the correlate represents a synonymous dimension for the similarity of the development sections, a maximum value selection circuit is to be used here and, with inverse allocation which is also applicable in principle, a minimum value selection circuit. The limit value selection circuit GG has outputs allocated to the correlates $K_1$ to $K_3$ which are not further identified whereby always only that output has an affirmative binary signal which is allocated to the respective largest correlate or to that phase angle difference $d_1$ to $d_3$ which, in its development, has the greatest similarity with that of the local phase angle $d_m$. The pertinent given equivalent reactance value $X_{e1}$ to $X_{e3}$ is then switched as the result to the output A by means of output logic AL.

Figure 2:
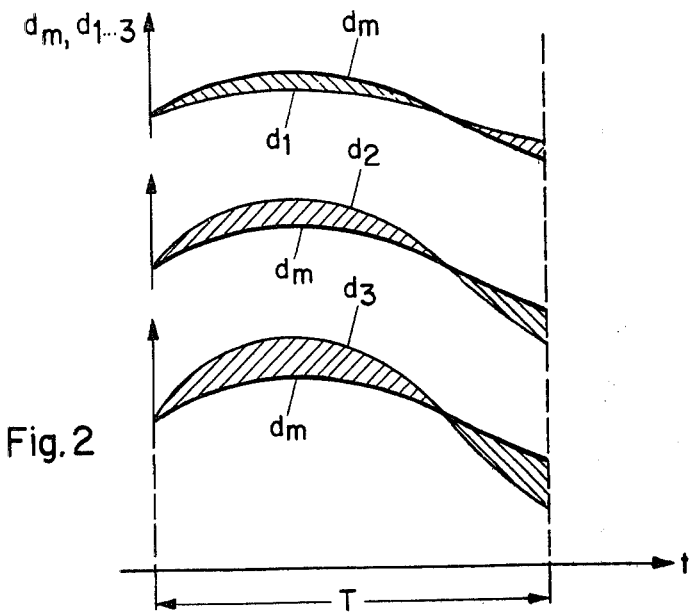
FIG. 2 is a phase angle time diagram to explain the process of the invention.

FIG. 2 shows, over time, three courses, given as examples, of the phase angle difference $d_1$ to $d_3$ for correspondingly different, given values of the equivalent reactance $X_{e1}$ to $X_{e3}$. These values are selected in practice according to plausibility considerations by taking into account the known high supply line conditions in such a way that the real reactance value is within the variation range of the given values. The similarity analysis of the development, always through a time interval T, can, for example, be carried out as shown in FIG. 2 by the formation of the difference between $d_m$ and $d_1$ to $d_3$ (see the hatched difference surfaces) with correlation of the differential value with one of the difference-forming dimensions, for example, $d_m$. In this case, an inverse similarity criterion is obtained with corresponding minimum value selection. The correlation itself can be carried out in the customary manner by multiplication—in the case of the example, therefore, of the differential value—with one of the difference-forming dimensions and integration over the interval T.

Figure 3A:
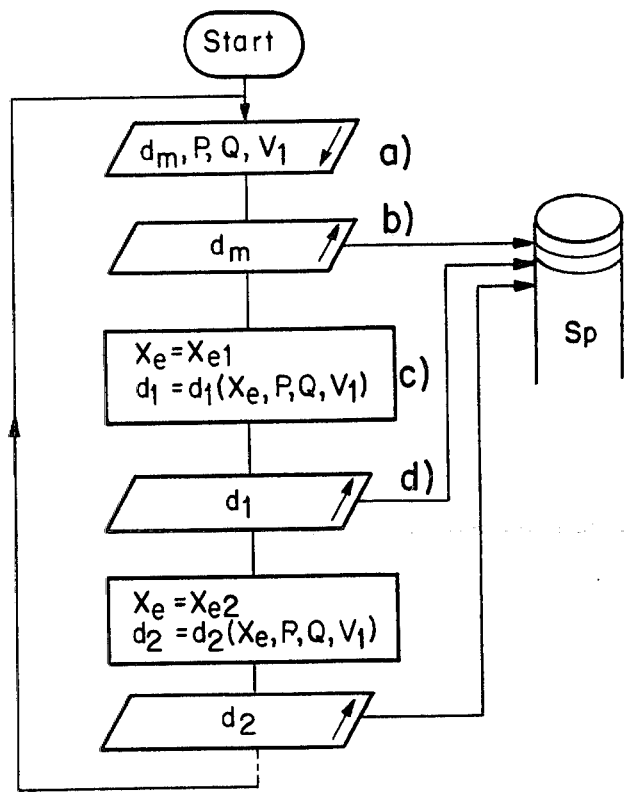
FIGS. 3a and 3b are flow charts illustrating the performance of the process according to the invention in a general form.

FIG. 3 shows a first, cyclically developing section of the process. Accordingly, following the start of the process, always a set of measured dimensions $d_m$, P, Q, $V_1$ is taken up in step (a) of the process and, subsequently, the dimension $d_m$ is released into a memory Sp in step (b) of the process. Now, by using the measured dimensions P, Q, $V_1$ and the given reactance value $X_{e1}$, the dimension $d_1$ of the phase angle difference is determined in step (c) of the process and stored in the memory Sp in the subsequent step (d) of the process. The process continues in this manner with the introduction of the remaining given reactance values to $X_{e3}$ with the formation and output of the last value of the phase angle difference, i.e. for example, $d_3$. A new cycle run follows starting with the acceptance of a new set of the measured values $d_m$, P, Q, $V_1$.

It is expedient to use a memory renewing its content cyclically step-by-step, a so-called "rotating" memory, in which always the developments of the dimensions $d_m$ and $d_1$ to $d_3$ are stored over a time interval T. The renewal is effected in the customary manner by overwriting the longest stored set of values by the one last taken up. Therefore, suitable development sections are always available in the memory for the similarity analysis.

Figure 3B:
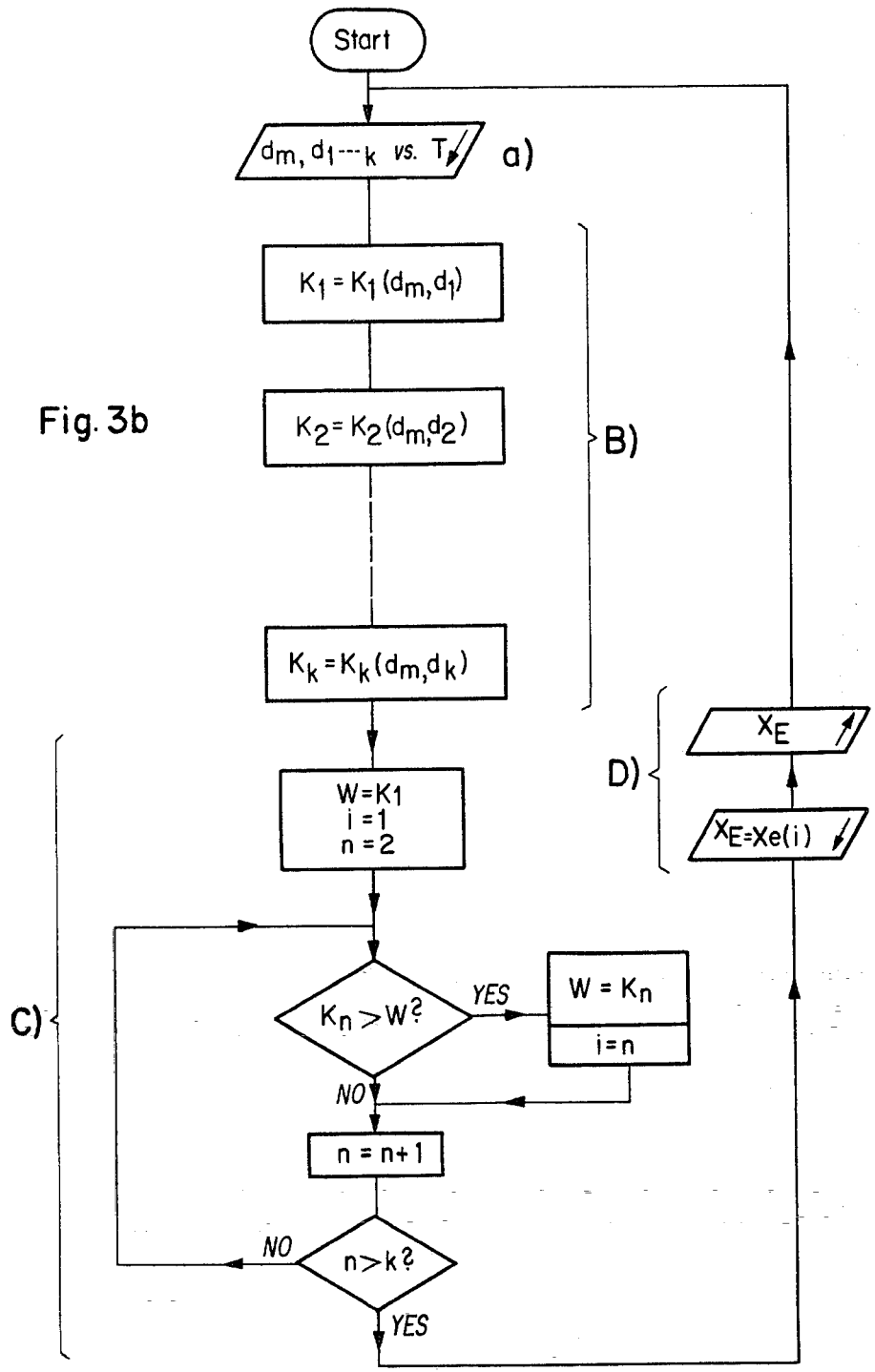

The further processing, again in a cyclic run, is illustrated in FIG. 3b. Here, always a set of values, extending over the interval T, of the dimensions $d_m$, $d_1$ to $d_3$, is taken up after the start in step (a) of the process and is, subsequently subjected to the similarity analysis with the formation of the correlates $K_1$ to, generally, $K_k$ in the multi-step section (B) of the process. Then, there follows, in section (C) of the process, the limit value selection of the characteristic similarity quantities, for example, the maximum value selection of the synonomous similarity-characterizing correlates $K_1$ to $K_k$ by using an auxiliary dimension W initially placed equal to $K_1$ as well as the sequence numbers i and n. The cycle used for this purpose is terminated with the checking of all characteristic quantities (n=k) with the identification of the sequence number i of the largest correlate and output of the pertinent reactance value $X_{e(i)}$ as the result. Subsequently, the process can continue its cyclic run so that a permanent line identification is given for control and guide purposes.

Obviously, numerous additional modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. A process for the determination of a longitudinal equivalent reactance in an electric power supply line with reference to a measuring point, particularly at the connecting point of a generator in a supply line, comprising:

forming at the measuring point ($x_m$), measuring signals for the system voltage ($V_1$), real power (P) and apparent power (Q) as well as for the phase angle ($d_m$) of the system voltage ($V_1$) relative to a local reference ($V_r$);

forming a plurality of values ($X_{e1}$, $X_{e2}$, $X_{e3}$) of the equivalent reactance to be determined in advance and determining a pertinent phase angle difference of the system voltage ($d_1$ to $d_3$) for each of these values with the help of the measuring signals for system voltage ($V_1$), real and apparent power (P or Q, respectively);

comparing the course of each phase angle difference of the system voltage ($d_1$ to $d_3$) with that of the phase angle ($d_m$) of the power voltage ($V_1$) at the measuring point ($x_m$) and forming respective correlation characteristics ($K_1$ to $K_3$) based thereon;

subjecting the correlation characteristics ($K_1$ to $K_3$) to a limit value selection wherein that phase angle difference of the system ($d_1$ to $d_3$) which is closest in similarity to the phase angle ($d_m$) of the system voltage ($V_1$) is identified;

outputting the respective equivalent reactance value ($X_{e1}$, $X_{e2}$, $X_{e3}$) associated with the phase angle difference of the system ($d_1$ to $d_3$) identified as being closest in similarity to the phase angle ($d_m$) of the system voltage ($V_1$).

2. A process according to claim 1, further comprising:

storing the course of the system voltage phase angle ($d_m$) at the measuring point ($x_m$) and of the system voltage phase angle differences ($d_1$ to $d_3$) in sections in accordance with the advance equivalent reactance values ($X_{e1}$ to $X_{e3}$) or corresponding defining quantities;

and performing an integral similitude check always through such a section at the measuring point between the individual system voltage phase angle differences ($d_1$ to $d_3$) and the system voltage phase angle ($d_m$).

3. A process according to claim 2 further comprising:

performing a difference formation between system voltage phase angle ($d_m$), on the one hand, and one system voltage phase angle difference ($d_1$ to $d_3$) each, on the other hand, as well as an integral correlation with one of the difference-forming quantities ($d_m$ or $d_1$ to $d_3$, respectively) for the similitude checking.

4. A process according to claim 2 further comprising:

performing a current, step-by-step renewal of the respectively stored sectional courses with the storage of always an up-to-date, new value and the cancellation of the stored value having been in the storage for the longest period of time.

5. A process according to claims 1, 2, 3 or 4, further comprising:

filtering the time behavior of the system voltage phase angle ($d_m$) and that of the system in a filter characterized by a transfer function having differential components for the suppression of components linear in time.

6. A process according to claim 5, wherein said filtering step comprises:

filtering by means of a filter characterized by a transfer function having differential and integral components.

7. A system for the determination of the phase angle ($d_m$) of a system voltage ($V_1$) at a measuring point ($x_m$), particularly for the performance of a process according to claim 1, comprising:

a measuring device for the phase angle difference measurement and including an at least approximately fixed oscillator as a reference indicator.

8. A system according to claim 6, further comprising:

said phase angle difference measuring device comprising a filter exhibiting a transfer function characterized at least by a differential component.

9. A system according to claim 8, wherein said filter transfer function is further characterized by integral components.

* * * * *